United States Patent
Fischer et al.

(10) Patent No.: US 8,963,413 B2
(45) Date of Patent: Feb. 24, 2015

(54) DEVICE COMPRISING AN ORGANIC LIGHT EMITTING DISPLAY

(75) Inventors: Jorg Fischer, Berlin (DE); Oliver Muth, Berlin (DE); Manfred Paeschke, Basdorf (DE); Michael Hagemann, Berlin (DE); SungChul Kim, Gyoenggi-do (KR); JohnHyuk Lee, Seoul (KR); DongWon Han, Seoul (KR); JinHo Kwack, Kyounggi-do (KR); JaeHo Lee, Gyoenggi-do (KR); DongHun Kang, Gyoenggi-do (KR); DaeBeom Shin, Kyoengnam (KR); HyoJin Kim, Gyoenggi-do (KR)

(73) Assignees: Bundesdruckerei GmbH (DE); Samsung Display Co., Ltd. (KR)

( * ) Notice: Subject to any disclaimer, the term of this patent is extended or adjusted under 35 U.S.C. 154(b) by 225 days.

(21) Appl. No.: 13/391,871

(22) PCT Filed: Aug. 27, 2010

(86) PCT No.: PCT/EP2010/005274
§ 371 (c)(1),
(2), (4) Date: Feb. 23, 2012

(87) PCT Pub. No.: WO2011/023397
PCT Pub. Date: Mar. 3, 2011

(65) Prior Publication Data
US 2012/0146489 A1    Jun. 14, 2012

(30) Foreign Application Priority Data
Aug. 29, 2009 (DE) .......................... 10 2009 038 904

(51) Int. Cl.
*H01J 1/63* (2006.01)
*H01J 9/20* (2006.01)
(Continued)

(52) U.S. Cl.
CPC ....... *B32B 17/10073* (2013.01); *B32B 17/1077* (2013.01); *B32B 27/06* (2013.01); *H01L 51/5237* (2013.01); *C09K 11/06* (2013.01); *H05B 33/10* (2013.01); *B42D 2033/44* (2013.01); *B42D 2033/46* (2013.01); *C09K 2211/14* (2013.01); *B42D 25/00* (2014.10); *B42D 25/45* (2014.10)
USPC ................................ 313/504; 445/23; 445/24

(58) Field of Classification Search
None
See application file for complete search history.

(56) References Cited

U.S. PATENT DOCUMENTS

| 6,281,525 B1 | 8/2001 | Krijn et al. |
| 6,815,070 B1 | 11/2004 | Buerkle et al. |

(Continued)

FOREIGN PATENT DOCUMENTS

| DE | 19959084 | 6/2001 |
| DE | 102006030406 | 1/2008 |

(Continued)

*Primary Examiner* — Ashok Patel
(74) *Attorney, Agent, or Firm* — Ann Wieczorek; Mayer & Williams PC

(57) ABSTRACT

The invention relates to a sandwich structure (1) comprising a flexible Organic Light Emitting Diode (OLED) (2), wherein the opposite outer surfaces (3, 4) of said OLED (2) consist of a glass material, and at least one layer (5, 6) provided on at least one of said outer surfaces (3, 4) of said OLED (2) and comprising an organic polymer material, wherein said layer (5, 6) comprising an organic polymer material and said outer surface (3, 4) consisting of glass are bonded to each other in a stacking manner by a bonding layer (7, 8).

29 Claims, 1 Drawing Sheet

Figure 1:
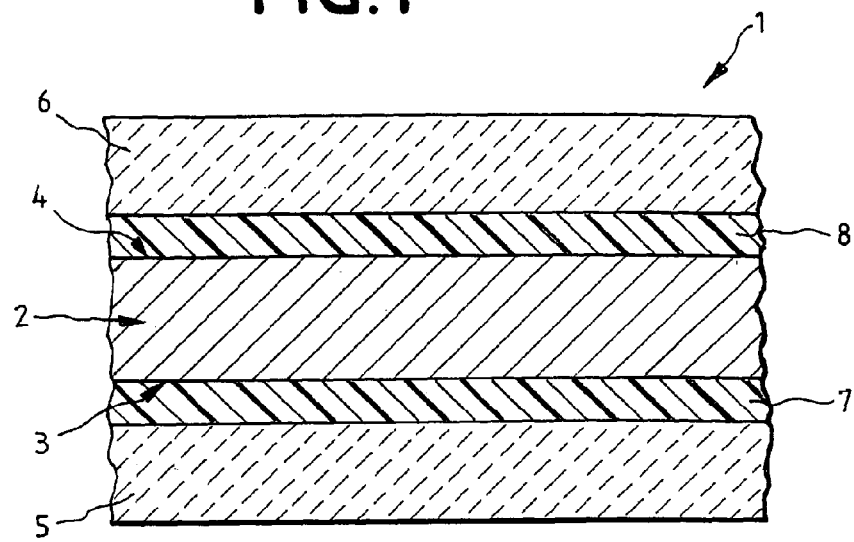

(51) Int. Cl.
*H01J 9/00* (2006.01)
*B32B 17/10* (2006.01)
*B32B 27/06* (2006.01)
*H01L 51/52* (2006.01)
*C09K 11/06* (2006.01)
*H05B 33/10* (2006.01)
*B42D 25/00* (2014.01)
*B42D 25/45* (2014.01)

(56) References Cited

U.S. PATENT DOCUMENTS

| | | | |
|---|---|---|---|
| 7,186,465 B2* | 3/2007 | Bright | 428/482 |
| 7,229,703 B2* | 6/2007 | Kawashima et al. | 428/690 |
| 2003/0015123 A1 | 1/2003 | Rozumek et al. | |
| 2005/0236985 A1 | 10/2005 | Handa et al. | |
| 2005/0269943 A1 | 12/2005 | Hack et al. | |
| 2006/0132032 A1* | 6/2006 | Schaepkens et al. | 313/512 |
| 2007/0273281 A1 | 11/2007 | Biebel | |
| 2008/0035736 A1 | 2/2008 | Tompkin et al. | |
| 2008/0303431 A1* | 12/2008 | Aiba et al. | 313/504 |
| 2010/0066072 A1 | 3/2010 | Paeschke et al. | |

FOREIGN PATENT DOCUMENTS

| | | |
|---|---|---|
| EP | 1439741 | 7/2004 |
| EP | 2130672 | 12/2009 |
| JP | 05-159877 | 6/1993 |
| JP | 2003-337549 | 11/2003 |
| JP | 2005-019082 | 1/2005 |
| JP | 2007-010834 | 1/2007 |
| JP | 2007-180262 | 7/2007 |
| JP | 2009-283155 | 3/2009 |
| WO | 2005110741 | 11/2005 |
| WO | 2008117848 | 10/2008 |

* cited by examiner

DEVICE COMPRISING AN ORGANIC LIGHT EMITTING DISPLAY

FIELD OF THE INVENTION

The invention relates to sandwich structures comprising Organic Light Emitting Displays (OLED), wherein the opposite outer surfaces of said OLED consist of a sealing or barrier layer e.g. consisting of a glass material. The invention further relates to devices comprising such sandwich structures and processes for manufacturing such sandwich structures and devices.

BACKGROUND OF THE INVENTION

OLEDs and displays comprising OLEDs have become increasingly interesting for display purposes, in particular for small devices, like hand held devices, including value and security documents, because they may be produced as very thin layers. Additionally, OLED displays may be flexible (sometimes called FOLEDs for Flexible Organic Light Emitting Diode) due to the fact that they can be made from films of organic materials on flexible substrates, including flexible drive circuits, thus being capable to be adapted to non-plane surfaces and/or incorporated into structures, which themselves need to have flexible properties, like bank notes (bills) and the like. Furthermore, the efficiency is higher, as compared e.g. to Liquid Crystal Displays (LCD) due to the fact that they actively emit light by way of luminescence, whereas LCDs typically need background illumination. Furthermore, OLEDs have very small response times, 0.01 ms and less, compared with LCDs (about 2 ms). Finally, OLEDs and displays with pixels made of OLEDs may be produced in a very simple manner, e.g. using conventional printing techniques. OLEDs typically comprise an anode, a conductive layer, an emissive layer and a cathode, wherein at least the layer(s) adjacent to one side of the emissive layer is transparent or semi-transparent. Often the anode material is Indium tin oxide, which is sufficiently transparent. Drive circuits as used for active matrix displays are, for example made of low temperature polysilicon.

However, one problem is the sensitivity of the OLED materials to oxygen and/or moisture resulting in rather low lifetimes. This may e.g. be handled by placing the actual OLED components between two glass layers, which are essentially free of oxygen and/or vapor diffusion. Another possibility is to use OLED display on glass substrate with a barrier layer. These barrier layers e.g. can be build up of Silicon-Oxides ($SiO_2$), (Boro-)Silicates, aluminates ($Al_2O_3$) or metal layer (Al, Ag, Au, Rh) or other corresponding materials. Such OLED structures or devices remain flexible, provided that the glass layers have a thickness below certain limits. Typically, OLEDs comprising glass layers and having a thickness of 100 μm or less still have the required flexibility for most purposes. But such thin glass layers, i.e. below 50 μm, or even below 20 μm, have the problem that they become very fragile and tend to break due to their brittleness. Thus, it is from this aspect desirable to bond such OLEDs to mechanically tough (flexible or non-flexible) substrates for stabilization purposes.

OLEDs with the above-mentioned structures, however, have the further problem that glass is a material which exhibits rather poor adhesion properties. For example bonding of such a glass armed OLED display to a polymeric substrate or lamination thereof within a stack of polymeric layers leads to poor bonding durability. In particular in case of lamination, delamination readily takes place, which is of particular disadvantage, if the OLED display is integrated into e.g. a value and/or security document, since separation of components of such documents may be utilized for making counterfeits by integration of obtained authentic components into such counterfeits.

Technical Problem of the Invention

The technical problem underlying the instant invention comprises to provide a structure comprising a glass armed OLED or OLED display, which is less fragile, may retain flexibility and has improved durability with respect to monolithic properties.

SUMMARY OF THE INVENTION AND PREFERRED EMBODIMENTS

For achieving these objects, the invention teaches a sandwich structure comprising: an Organic Light Emitting Diode (OLED), wherein at least one of the both outer opposite surfaces of said OLED consists of a glass material, and at least one layer provided on the at least one outer opposite surface of said OLED consisting of glass, wherein said layer comprises an organic polymer material, and wherein said layer comprising an organic polymer material and said outer surface consisting of glass are bonded to each other in a stacking manner by an intermediate bonding layer.

The phrase OLED in this context includes displays which comprise a matrix of OLEDs and related drive circuits.

Within certain embodiments, both outer opposite surfaces of said OLED consist of glass. In other embodiments only one of the opposite surfaces consists of glass and the other one of a diffusion barrier layer material common in the OLED art. Such diffusion barrier materials comprise inorganic materials, like metals and metal alloys or ceramics, e.g. $SiN_x$, $AlO_x$, but also organic materials, which exhibit very low diffusion rates for oxygen and water vapor. These diffusion barriers can be transparent, semi-transparent or not transparent. In the latter case the OLED can only be viewed from the side with the outer surface consisting of glass.

An OLED may, in addition, comprise one or several additional layers arranged between the electrode layers and/or drive circuits and the opposite outer surfaces of glass or other materials. Of course, the opposite outer surfaces are constituted by respective outermost layers made of the materials outlined above for the surfaces.

By providing a bonding layer between the glass material and the layer comprising an organic polymeric material an structure is formed, which is less fragile, but still flexible. Furthermore, the bonding layer ensures that the sandwich structure remains durable and resists delamination.

The glass material may by any glass material used in the art. It may, in particular be selected from the group consisting of silica glasses, phosphates, borates, chalcogenides, fluorides (fluorozirconates, fluoroaluminates), germanates, antimonates, arsenates, titanates, tantalates, nitrates, carbonates, and blends of such materials. Preferred glass materials are silica glasses, which may comprise usual additives like sodium carbonate, calcium oxide, magnesium oxide, aluminum oxide, barium, thorium oxide, lanthanium oxide, cerium (IV) oxide, calumite, sodium sulfate, sodium chloride, and/or antimony oxide and the like.

The OLED may be of any kind, including polymeric OLEDs or a small molecule OLEDs. The specific structure of the OLEDs employed within the invention is irrelevant and any variant known in the art may be used.

It is preferred to use OLED display on glass substrate with barrier layers. These barrier layers e.g. can be build up of coatings comprised of alternating layers of polymer and inorganic thin films e.g. Silicon-Oxides ($SiO_2$), (Boro-)Silicates, aluminates ($Al_2O_3$) or metal layer (Al, Ag, Au, Rh) or other corresponding materials.

The organic polymer material may be of any kind employed in the art, e.g. in the manufacturing of value and/or security documents or for supporting displays. Examples include the group consisting of polycarbonate (PC) (being preferred), carboxy-modified PC, polyethylenterephthalate (PET), derivatives of PET including glycol-modified PET (PETG) and carboxy-modified PET, polyethylennaphthalate (PEN), acrylonitrile-butadiene-styrole-copolymer (ABS), polyvinylchloride (PVC), polyvinylbutyral (PVB, polymethylmethacrylate (PMMA), polyimide (PI), polyvinylalcohol (PVA), polystyrole (PS), Polyvinylphenole (PVP), Polyethylene (PE), polypropylene (PP), paper, and derivatives and blends and laminates of these materials. Carboxy-modified PC is, for example described in detail in U.S. Pat. No. 4,959,411, which is herewith incorporated by reference.

With respect to durability it is preferred that two of said layers comprising said organic polymer material are provided and one thereof is bonded to a first of said outer surfaces of said OLED, and the other is bonded to a second of said outer surfaces of said OLED, each by a first bonding layer and a second bonding layer. This provides a sandwich structure, which has a polymeric layer on each of its main surfaces. In this case it is also preferred that the circumference of the layers comprising the organic polymeric material is larger than the circumference of the OLED, thereby contacting the two layers comprising the organic polymeric material adjacent to the edges, preferably all edges, of the OLED. This leads to a complete encapsulation of the OLED between the layers comprising the organic polymeric material. Then it is further preferred, that the organic polymeric materials of both layers either blend into each other, are solvable in each other, or even react with each other, thus obtaining a tight bond around the edges of the OLED and providing a monolithic structure, which is of even further improved resistance against delamination. This is, in particular provided in case that the organic polymer materials covering different outer surfaces of said OLED are the same. Examples for polymeric materials with reactive groups and laminates made therefrom are provided e.g. in the patent application DE 10 2007 037 721, which is herewith incorporated by reference.

Various materials may be employed for the bonding layer. First, the bonding layer may comprise a compound selected from the group consisting of derivatives of multifunctional alkoxysiloxanes or alkoxy titanates like octamethyltrisiloxan, tetrapropylorthosilicate, titanium tetrabutanolat, tetrakis(2-butoxyethyl)orthosilicate and mixtures of such compounds. Just one example for such a material is the Dow Corning® primer 1200 OS. Second, said bonding layer may comprise or consist of an ethylene-vinylacetate-copolymer. Said ethylene-vinylacetate-copolymer may comprise vinylacetate groups in an amount of 40% to 90% of the total number of polymeric units.

Examples include the product series Levamelt® 400, 450, 452, 456, 500, 600, 686, 700, 800, 900 VP and VP KA 8865 obtainable from Lanxess Deutschland GmbH, Leverkusen, Germany. Third, said bonding layer may comprise a polyurethane (being preferred), in particular a thermoplastic polyurethane, including aliphatic thermoplastic polyurethane. Examples include EPUREX® Platilon foils.

Fourth, and of significant importance, said bonding layer may comprise a bonding compound having the structure A-C or A-B-C, wherein A is a group reactive with said glass material, B is a spacer group, and C is a group reactive with said organic polymer material. This provides chemical bonds between the different layers leading to a monolithic structure, which is essentially secure against delamination. Any attempt of delamination for obtaining components from the laminated structure, in particular the OLED, with the purpose of making counterfeits is useless, since this will lead to irreversible damages of the OLED, rendering it useless for the counterfeit.

The group A is preferably reactive with silica based glass. It may, as an example, be selected from the group of multifunctional silyl-compounds like e.g. of trialkoxysilyl, diakloxyalkylsilyl, trimethoxysilyl, triethoxysilyl, methyldimethylsilyl, methyldiethylsilyl, ethyldimethylsilyl, ethyldimethylsilyl, trihalidesilyl, and trichlorosilyl.

The group B, which is not necessarily present, may be a spacer group. This is of advantage for compensating mechanical stress between the polymeric layer and the glass layer due to differences in the thermal expansion coefficients, since the spacer group may impart elasticity to some extent. The spacer group may a C1 to C20 alkyl, $—(CH_2)_n—$, substituted or not substituted, linear or branched in particular methyl, ethyl, propyl, butyl(iso-butyl)-pentyl, hexyl-, septyl-, octyl-, nonyl-, decyl-, dodecyl-, hexadecly- Other suitable spacer groups include aryl-groups like $—(CH_2—CH_2—O)_n—$, $—(SiR_2—O)_n—$, $—(C_6H_4)_n—$, $—(C_6H_{10})n—$, C3-C(n+3)-Aryl, C4-C(n+4)-aralky, linear or branched, saturated or unsaturated, optionally substituted, or corresponding heterocycles with one or several different or the same heteroatoms O, N, or S, wherein n is 1 to 20, preferably 1 to 10. Further specific examples are $—CH=CH—$, $—O—(CH_2)_n—$, $—(CH_2)_n—NH—$, $—(CH_2)_n—COO—$, and $—(CH_2)_n—CONH—$.

The group C may, for example, be selected from the group consisting of vinyl, chloride, bromide, iodide, amino, aminoalkyl, aminoalkylamine, aminoalkylalkylamine, mercapto, sulfide, polysulfide, epoxy, 7-oxabicyclo[4.1.0]heptyl, methacryl, styryl, cyano, isocyano, hydroxy, carboxy, carboxyester, alkylketo, trialkoxysilyl, diakloxyalkylsilyl, and trichlorosilyl. Other groups include $—OCN$, $—NCO$, $—NCS$, $—SCN$, $—N^{2+}$, $S_X$, Trifluorsulfate (Triflat, $CF_3SO_3^-$), Toluenesulfate (Tosylat, $C_7H_7SO_3^-$), MethylSulfate (Mesylate, $CH_3SO_3^-$) and $—CHO$.

In the sandwich structure of the invention the OLED (i.e. including the glass layers) typically has a thickness of less than 100 µm, in particular less than 80 µm, preferably less than 50 µm. The total thickness of the sandwich structure may be in the range from 70 µm to 1000 µm, preferably from 70 µm to 300 µm.

A specific embodiment of the sandwich structure of the invention comprises the following layer structure: a polymer layer, a bonding layer, an OLED, a bonding layer, a polymer layer, wherein at least one of the both outer opposite surfaces of said OLED consists of a glass material, and at least one layer provided on the outer opposite surfaces of said OLED comprises an organic polymer material and is bonded to each other in a stacking manner by an intermediate bonding layer. It is preferred that two of said layers comprising said organic polymer material are provided and one thereof is bonded to a first of said outer surfaces of said OLED, and the other is bonded to a second of said outer surfaces of said OLED, each by a first bonding layer and a second bonding layer. This provides a sandwich structure, which has a polymeric layer on each of its main surfaces.

The sandwich structures of the invention may be employed in various manners and in various devices. It may be used for manufacturing a display, wherein the sandwich structure is attached to a substrate, integrated into a substrate, or supported on a substrate, and wherein electric contacts of the drive circuits of the OLED are connected to electronic circuits for driving the OLED.

Support or attachment on a substrate comprises to fix the sandwich structure either mechanically or by way of adhesives to said substrate, which may be any kind and material and plane or with a curved surface. Integration essentially means lamination into further layers of various materials, preferably organic polymeric materials of the kind outlined above in other context. These materials will at least on one side of the OLED be transparent or semi-transparent. Integrated in such a manner, the sandwich structure of the invention may be incorporated into value- and/or security documents, mobile phones, palm top computers, navigation devices, electronic books, computers, television devices, or electronic devices and the like, essentially any device or apparatus, which requires display means. Value and/or security documents in particular comprise identity cards, passports, access control cards, visa, tax stamps, tickets, driver licenses, vehicle papers, bills, checks, postal stamps, credit cards, any kind of chip cards, and product labels.

The invention further teaches a method for manufacturing a sandwich structure according to the invention comprising the steps of: A) providing an Organic Light Emitting Diode (OLED) (or a display comprising OLEDs), wherein the opposite outer surfaces of said OLED consist of a glass material, B) providing at least one layer comprising an organic polymer material, C) providing a bonding layer on at least one surface of said OLED and/or on one surface of said layer comprising an organic polymer material, D) thereafter stacking said OLED and said layer comprising an organic polymer material such that said bonding layer is located between said OLED and said layer comprising an organic polymer material, and E) application of elevated temperature and/or elevated pressure to the stack thus obtained for a predetermined period of time, thereby laminating said OLED, said bonding layer and said layer comprising an organic polymeric material together. The stack formed in step D) preferably comprises the layer sequence: layer comprising an organic polymer material, bonding layer, OLED, bonding layer, and layer comprising an organic polymer material.

The invention further is directed to a method for manufacturing a display comprising a sandwich structure according to the invention comprising the steps of: A) providing an Organic Light Emitting Diode (OLED) (or a display comprising such OLEDs), wherein the opposite outer surfaces of said OLED consist of a glass material, B) providing at least one layer comprising an organic polymer material, C) providing a bonding layer on at least one surface of said OLED and/or on one surface of said layer comprising an organic polymer material, D) thereafter stacking said OLED and said layer comprising an organic polymer material such that said bonding layer is located between said OLED and said layer comprising an organic polymer material, wherein optionally further layers, in particular polymeric layers, are further stacked onto one or both of the sides of the stack thus obtained and E) application of elevated temperature and/or elevated pressure to the stack thus obtained for a predetermined period of time, thereby laminating said OLED, said bonding layer and said layer comprising an organic polymeric material together, wherein electric contacts of the OLED are connected to electronic circuits for driving the OLED prior to during or after step E).

The invention is even further directed to a method for manufacturing a display comprising a sandwich structure according to the invention comprising the steps of: A) providing an Organic Light Emitting Diode (OLED) (or a display comprising such OLEDs), wherein one outer surfaces of said OLED consist of a glass material and the other outer surface of said OLED consists of barrier layers, B) providing at least one layer comprising an organic polymer material, C) providing a bonding layer on at least one surface of said OLED and/or on one surface of said layer comprising an organic polymer material, D) thereafter stacking said OLED and said layer comprising an organic polymer material such that said bonding layer is located between said OLED and said layer comprising an organic polymer material, wherein optionally further layers, in particular polymeric layers, are further stacked onto one or both of the sides of the stack thus obtained and E) application of elevated temperature and/or elevated pressure to the stack thus obtained for a predetermined period of time, thereby laminating said OLED, said bonding layer and said layer comprising an organic polymeric material together, wherein electric contacts of the OLED are connected to electronic circuits for driving the OLED prior to during or after step E).

Within the lamination procedures described above, the elevated temperature preferably is in the range from 20° C. to 200° C., preferably from 50° C. to 160° C., in particular from 50° C. to 100° C. The elevated pressure typically is in the range from 10 to 400 $N/cm^2$, preferably from 50 to 100 $N/cm^2$, e.g., but not limited thereto, in case of elevated temperatures and from 100 to 600 $N/cm^2$ in the case of non-elevated temperatures, i.e. room temperature in the range from 15° C. to 25° C. The period of time employed may be in the range from 1 s to 600 s, preferably from 1 s to 100 s, more preferably from 1 s to 30 s.

The aforementioned details outlined with respect to the sandwich structure of the invention apply in the same manner to the methods and uses of the invention and need not be explicitly repeated in this context. Furthermore, in cases where components are described as comprising materials or other components, they may as well consist thereof as an alternative.

In the following the invention is described by way of examples and figures.

FIG. 1: a sandwich structure of the invention, and

Figure 2:
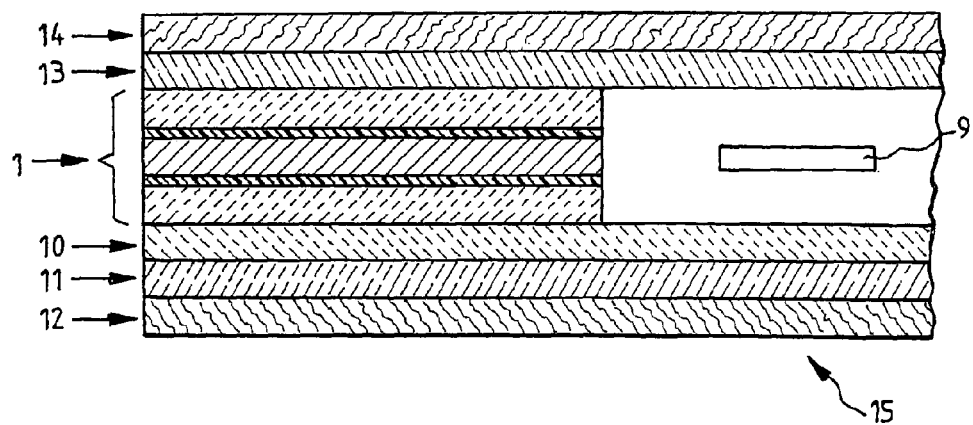

FIG. 2: a security document of the invention

FIG. 1 shows a sandwich structure 1 comprising an OLED display 2 with glass surfaces 3, 4 on each side. The OLED display 2 is embedded between two layers 5, 6 comprising a organic polymeric material, e.g. consisting of carboxy-modified PC. Between two bonding layers 7, 8 are evident, which bond the two layers 5, 6 comprising the organic polymeric material to the glass surfaces 3, 4. The bonding layers 7, 8 comprise a reactive component A-B-C, wherein A e.g. is trimethoxysilyl, B e.g. is ethyl, and C e.g. is epoxy. The trimethoxysilyl group has reacted with the glass creating a chemical bond between the glass and the reactive component. The epoxy group has reacted with carboxyl groups of the modified PC creating a chemical bond between the PC layer and the reactive group. As a result, the PC layer and the glass are chemically bonded to each over via the reactive agent and delamination by simple thermal exposure is not longer possible.

FIG. 2 shows a security document 15 comprising a sandwich structure 1 of the invention, in this case a chip card. Evident is a chip 9 comprising electronic circuits, like RFID circuits, processors, memories, crypto controllers and the like, including drivers for the OLED display 2. The chip 9 is embedded between layers 10, 11, 12, 13, and 14, e.g. made of PC, together with the OLED display 2. The OLED display 2 is electrically contacted with the chip 9 (not shown). One or several of the layers 10, 11, 12, 13, and/or 14 may carry printed images and/or characters, provided that the OLED display 2 may still be viewed at least from one side of the document 15.

The invention claimed is:

1. A sandwich structure comprising:
   an Organic Light Emitting Diode (OLED) having outer opposite surfaces, wherein at least one of the outer opposite surfaces of said OLED consists of a glass material, and
   at least one layer provided on the at least one outer opposite surfaces of said OLED consisting of glass, comprises an organic polymer material, and
   wherein said at least one layer comprising an organic polymer material and said outer surface consisting of glass are bonded to each other in a stacking manner by an intermediate bonding layer, and
   wherein said intermediate bonding layer comprises a bonding compound having the structure A-C or A-B-C wherein A is a group reactive with said glass material B is a spacer group, and C is a group reactive with said organic polymer material.

2. The sandwich structure according to claim 1, wherein the glass material is selected from the group consisting of silica glasses, phosphates, borates, chalcogenides, fluorides (fluorozirconates, fluoroaluminates), germanates, antimonates, arsenates, titanates, tantalates, nitrates, carbonates, and blends of such materials.

3. The sandwich structure according to claim 1, wherein the OLED is a polymeric OLED or a small molecule OLED.

4. The sandwich structure according to claim 1, wherein the organic polymer material is selected from the group consisting of polycarbonate (PC), carboxy-modified PC, polyethylenterephthalate (PET), derivatives of PET including glycol-modified PET (PETG) and carboxy-modified PET, polyethylennaphthalate (PEN), acrylonitrile-butadiene-styrole-copolymer (ABS), polyvinylchloride (PVC), polyvinylbutyral (PVB, polymethylmethacrylate (PMMA), polyimide (PI), polyvinylalcohol (PVA), polystyrole (PS), Polyvinylphenole (PVP), Polyethylene (PE), polypropylene (PP), paper, and derivatives and blends of these materials.

5. The sandwich structure according to claim 1, wherein two of said at least one layer comprising said organic polymer material are provided and one thereof is bonded to a first of said outer surfaces of said OLED, and the other is bonded to a second of said outer surfaces of said OLED, each by a first bonding layer and a second bonding layer.

6. The sandwich structure according to claim 5, wherein the organic polymer materials covering different outer surfaces of said OLED are different or the same.

7. The sandwich structure according to claim 1 wherein the bonding layer comprises a compound selected from the group consisting of octamethyltrisiloxan, tetrapropylorthosilicate, titanium tetrabutanolat, tetrakis(2-butoxyethyl)orthosilicate and mixtures of such compounds.

8. The sandwich structure according to claim 1, wherein said bonding layer comprises an ethylene-vinylacetate-copolymer.

9. The sandwich structure according to claim 8, wherein said ethylene-vinylacetate-copolymer comprises vinylacetate groups in an amount of 40% to 90% of the total number of polymeric units.

10. The sandwich structure according to claim 1, wherein said bonding layer comprises a polyurethane.

11. A security document comprising a sandwich structure according to claim 1.

12. The sandwich structure according to claim 1, wherein the group A is reactive with silica based glass.

13. The sandwich structure according to claim 12, wherein the group A is selected from the group consisting of trialkoxysilyl, diakloxyalkylsilyl, trimethoxysilyl, triethoxysilyl, methyldimethylsilyl, methyldiethylsilyl, ethyldimethylsilyl, ethyldimethylsilyl, trihalidesilyl, and trichlorosilyl.

14. The sandwich structure according to claim 1, wherein the group B is a spacer group.

15. The sandwich structure according to claim 14, wherein the spacer group is a C1 to C20 alkandiyl, substituted or not substituted, in particular methdiyl, ethdiyl, propdiyl, isopropdiyl, butdiyl or isobutdiyl.

16. The sandwich structure according to claim 1, wherein the group C is selected from the group consisting of vinyl, fluoride, chloride, bromide, iodide, amino, aminoalkyl, aminoalkylamine, aminoalkylalkylamine, mercapto, sulfide, polysulfide, epoxy, 7-oxabicyclo[4.1.0]heptyl, methacryl, styryl, cyano, isocyano, hydroxy, carboxy, carboxyester, alkylketo, trialkoxysilyl, diakloxyalkylsilyl, and trichlorosilyl.

17. The sandwich structure according to claim 1, wherein said OLED has a thickness of less than 100 μm.

18. The sandwich structure according to claim 1, wherein the thickness of said sandwich structure is in the range from 70 μm to 1000 μm.

19. A method of using a sandwich structure according to claim 1, for manufacturing a display, comprising the step of attaching the sandwich structure to a substrate, integrated into a substrate, or supported on a substrate, and connecting electric contacts of the OLED to electronic circuits for driving the OLED.

20. A value document comprising a sandwich structure according to claim 1.

21. A mobile phone, palm top computer, navigation device, electronic book, computer, television device, or electronic device comprising a sandwich structure according to claim 1.

22. A method for manufacturing a sandwich structure according to claim 1 comprising the steps of:
   A) providing an Organic Light Emitting Diode (OLED) having opposite outer surfaces, wherein the opposite outer surfaces of said OLED consist of a glass material,
   B) providing at least one layer comprising an organic polymer material,
   C) providing a bonding layer on at least one surface of said OLED and/or on one surface of said layer comprising an organic polymer material, the bonding layer comprising a bonding compound having the structure A-C or A-B-C, wherein A is a group reactive with said glass material, B is a spacer group, and C is a group reactive with said organic polymer material,
   D) thereafter stacking said OLED and said layer comprising an organic polymer material such that said bonding layer is located between said OLED and said layer comprising an organic polymer material, and
   E) applying elevated temperature and/or elevated pressure to the stack thus obtained for a predetermined period of time, thereby laminating said OLED, said bonding layer and said layer comprising an organic polymeric material together.

23. The method according to claim 22, wherein the stack formed in step D) comprises the layer sequence: the layer comprising an organic polymer material, the bonding layer, the OLED, the bonding layer, and the layer comprising an organic polymer material.

24. A method for manufacturing a display comprising a sandwich structure according to claim 1 comprising the steps of:
- A) providing an Organic Light Emitting Diode (OLED) having opposite outer surfaces, wherein the opposite outer surfaces of said OLED consist of a glass material,
- B) providing at least one layer comprising an organic polymer material,
- C) providing a bonding layer on at least one surface of said OLED and/or on one surface of said layer comprising an organic polymer material, wherein said bonding layer comprises a bonding compound having the structure A-C or A-B-C, wherein A is a group reactive with said glass material, B is a spacer group, and C is a group reactive with said organic polymer material,
- D) thereafter stacking said OLED and said layer comprising an organic polymer material such that said bonding layer is located between said OLED and said layer comprising an organic polymer material, wherein optionally further layers, in particular polymeric layers, are further stacked onto one or both of the sides of the stack thus obtained and
- E) applying elevated temperature and/or elevated pressure to the stack thus obtained for a predetermined period of time, thereby laminating said OLED, said bonding layer and said layer comprising an organic polymeric material, and if present, the further layers together, wherein electric contacts of the OLED are connected to electronic circuits for driving the OLED prior to, during, or after step E).

25. The sandwich structure according to claim 1, wherein said bonding layer comprises a thermoplastic polyurethane.

26. The Sandwich structure according to claim 1, wherein said bonding layer comprises a aliphatic thermoplastic polyurethane.

27. The sandwich structure according to claim 1, wherein said OLED has a thickness of less than 80 μm.

28. The sandwich structure according to claim 1, wherein said OLED has a thickness of less than 50 μm.

29. The sandwich structure according to claim 1, wherein the total thickness of said sandwich structure thereof is in the range from 70 μm to 300 μm.

* * * * *